US008947964B2

(12) United States Patent
Na et al.

(10) Patent No.: US 8,947,964 B2
(45) Date of Patent: Feb. 3, 2015

(54) CURRENT SENSE AMPLIFIERS, MEMORY DEVICES AND METHODS

(75) Inventors: Onegyun Na, Boise, ID (US); Jongtae Kwak, Boise, ID (US); Seong-Hoon Lee, Boise, ID (US); Hoon Choi, Boise, ID (US)

(73) Assignee: Micro Technology, Inc., Boise, ID (US)

( * ) Notice: Subject to any disclaimer, the term of this patent is extended or adjusted under 35 U.S.C. 154(b) by 207 days.

(21) Appl. No.: 12/820,050

(22) Filed: Jun. 21, 2010

(65) Prior Publication Data

US 2011/0310687 A1 Dec. 22, 2011

(51) Int. Cl.
*G11C 7/02* (2006.01)
*G11C 7/06* (2006.01)
*G11C 11/4091* (2006.01)

(52) U.S. Cl.
CPC *G11C 7/062* (2013.01); *G11C 7/02* (2013.01); *G11C 11/4091* (2013.01); *G11C 2207/063* (2013.01)
USPC ............................................ 365/207

(58) Field of Classification Search
USPC ........... 365/207, 189.07, 189.06, 185.21, 206
See application file for complete search history.

(56) References Cited

U.S. PATENT DOCUMENTS

| 5,013,943 | A  | * | 5/1991 | Hirose ............................ 327/51 |
| 5,347,183 | A  | * | 9/1994 | Phelan ............................ 327/52 |
| 6,281,713 | B1 | * | 8/2001 | Kim ................................ 327/55 |
| 6,285,611 | B1 | * | 9/2001 | Kang .............................. 365/205 |
| 7,489,165 | B2 | * | 2/2009 | Gans .............................. 327/51 |
| 7,567,465 | B2 |   | 7/2009 | Jung et al. ................. 365/189.05 |
| 7,969,794 | B2 | * | 6/2011 | Kang et al. ............... 365/189.08 |
| 2007/0024325 | A1 | * | 2/2007 | Chen ............................... 327/55 |
| 2008/0002481 | A1 | * | 1/2008 | Gogl et al. ................ 365/189.06 |
| 2009/0059707 | A1 | * | 3/2009 | Jung et al. ................ 365/230.02 |

FOREIGN PATENT DOCUMENTS

KR      2008010164    *   1/2008

* cited by examiner

*Primary Examiner* — Kretelia Graham
(74) *Attorney, Agent, or Firm* — Dorsey & Whitney LLP

(57) ABSTRACT

A current sense amplifier may include one or more clamping circuits coupled between differential output nodes of the amplifier. The clamping circuits may be enabled during at least a portion of the time that the sense amplifier is sensing the state of a memory cell coupled to a differential input of the sense amplifier. The clamping circuits may be disabled during the time that the sense amplifier is sensing the state of a memory cell at different times in a staggered manner. The clamping circuits may be effecting in making the current sense amplifier less sensitive to noise signals.

20 Claims, 9 Drawing Sheets

CURRENT SENSE AMPLIFIERS, MEMORY DEVICES AND METHODS

TECHNICAL FIELD

Embodiments of this invention relate to memory devices and methods, and, more particularly, current sense amplifiers and methods and memory devices and methods using current sense amplifiers.

BACKGROUND OF THE INVENTION

Memory devices typically include a plurality of memory cells, which may be arranged in an array of intersecting rows and columns. The location of each cell in the array may be indicated with an address, such as a row address and/or a column address. The memory cells may be read by selecting a row of memory cells with a corresponding row address. A bit of stored data may then be coupled from all or some of the columns in the addressed row.

Memory devices may store data using a variety of techniques. For example, dynamic random access memory ("DRAM") devices may use memory cells that are essentially small capacitors that store data based on the amount of charge stored in the capacitors. When a memory cell is read, the memory cell may be coupled to a digit line so that the charge of the capacitor is shared with a charge of the digit line to which it is coupled. This charge sharing results in a small change in the voltage to which the digit line had been previously charged. A respective sense amplifier coupled to each digit line may be utilized to sense a small differential between the voltage on the digit line and the voltage on a complementary digit line. Voltage sense amplifiers have long been used in this manner to sense voltage differentials between complementary digit lines. However, voltage sense amplifiers may not function well over a wide range of power supply voltages, particularly at the low end of the range. For example, at low supply voltages the sense amplifier may not respond quickly enough to the voltage differential being sensed.

Another type of sense amplifier that may function better than voltage sense amplifiers in some cases, particularly at low supply voltages, are current sense amplifiers. Current sense amplifiers sense a differential in the current flow from complementary digit lines resulting from coupling one of the digit lines to a memory cell, such as a DRAM memory cell. However, at lower supply voltage, even current sense amplifiers may be unable to respond to a current differential with sufficient speed, and they may tend to incorrectly respond to noise signals, thereby producing invalid data results. This problem may be particularly acute as the electrical characteristics of electrical components used in current sense amplifiers may charge responsive to process, supply voltage and temperature variations.

DETAILED DESCRIPTION

Figure 1:
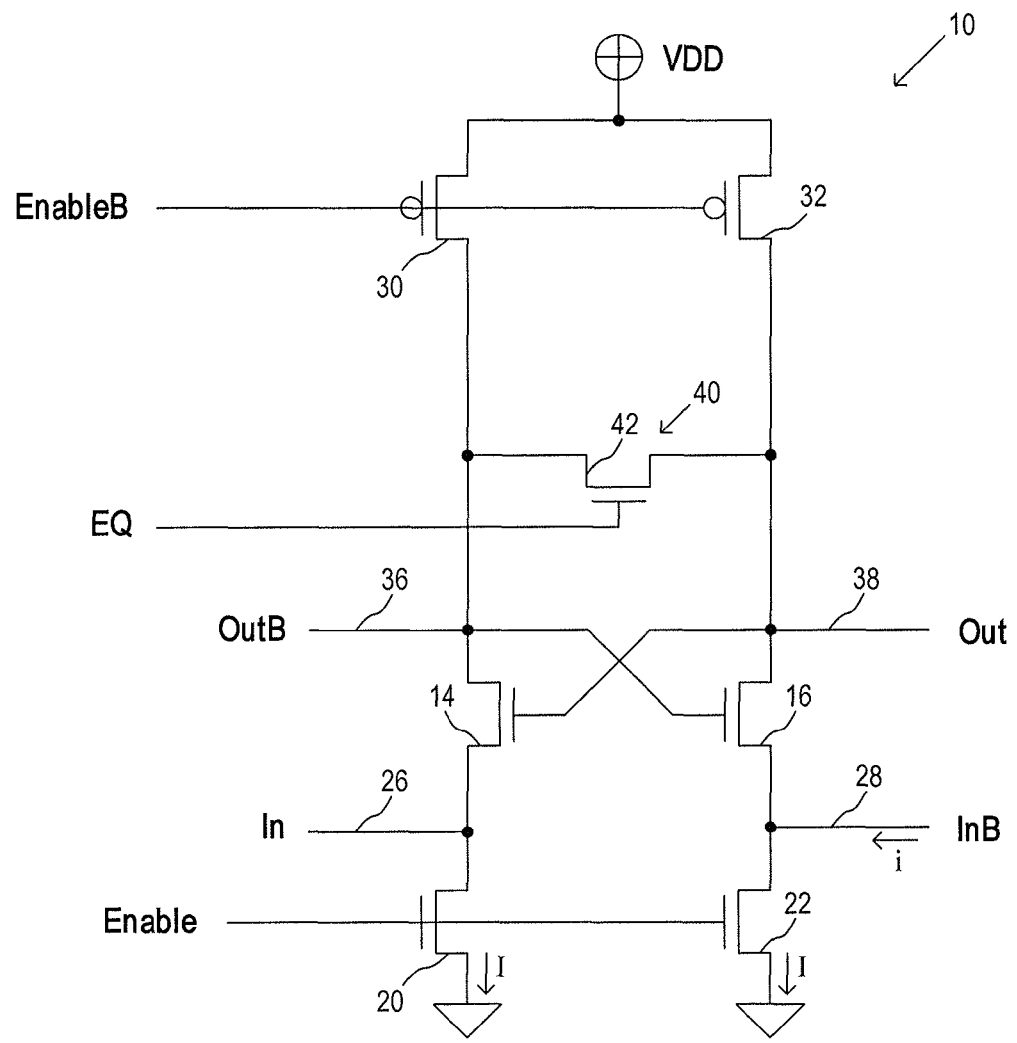
FIG. 1 is a schematic diagram of an embodiment of a prior art current sense amplifier.

An embodiment of a conventional current sense amplifier 10 is shown in FIG. 1. The current sense amplifier 10 includes a pair of NMOS current sensing transistors 14, 16, which have their gates and drains cross-coupled to each other. Respective sources of the transistors 14, 16 may be coupled to the drains of respective NMOS transistors 20, 22, which may receive an active high Enable signal at their gates. The interconnected drains of the transistors 14, 20 may receive an input signal In at a first input node 26, while the interconnected drains of the transistors 16, 22 may receive a complementary input signal InB at a second input node 28. The sources of the transistors 20, 22 may be coupled to a first supply voltage, such as ground. The drains of the transistors 14, 16 may be coupled to the drains of respective PMOS transistors 30, 32, which may receive an active low EnableB signal at their respective gates. The interconnected drains of the transistors 14, 30 may provide an output signal OutB at a first output node 36, while the interconnected drains of the transistors 16, 32 may provide a complementary output signal Out at a second output node 38. The sources of the transistors 30, 32 may be coupled to a second supply voltage, such as $V_{DD}$. Finally, a clamping circuit 40 may be coupled between the drains of the sensing transistors 14, 16, and the gate of the transistor 42 receives an equilibration signal EQ.

In operation, the input nodes 26, 28 may be coupled to respective complementary digit lines (not shown). The sense amplifier may be energized by applying a high ENABLE signal to the gates of the transistors 20, 22, and applying a low ENABLEB signal to the gates of the transistors 30, 32. However, before a current differential is sensed by the sense amplifier 10, the clamping circuit 40 is turned ON by applying a high EQ signal to its gate, thereby coupling the drains of the sensing transistors 14, 16 to each other so that they are at substantially the same voltage when sensing of a memory cell commences. A memory cell may then be coupled to one of the input nodes 26, 28. For example, if a memory cell storing a logic "1" is coupled to the input node 28, a current i may be supplied to the input node 28, while no similar current is supplied to the input node 26. However, since the transistors 20, 22 are biased with the same voltage and the voltages of the digit lines coupled to the input nodes 26, 28 are substantially the same, the currents through the transistors 20, 22 are substantially equal. Thus, if a current of I flows through each of the transistors 20, 22, the current flowing through the transistor 14 will also be I, but the current flowing through the transistor 16 will be I−i. The relatively little current flowing through the transistor 16 compared to the current flowing through the transistor 14 may cause the voltage at the output node 38 to be less than the voltage at the output node 36, Further, gain provided by the sensing transistors 14, 16 may result in positive feedback, which amplifies this differential voltage. More specifically, the lower voltage at the output node 38 applied to the gate of the transistor 14 may cause the transistor 14 to be turned ON to a lesser degree than the transistor 16, thereby further raising the voltage at the output node 36. This increased voltage at the output node 36 is applied to the gate of the transistor 16 to turn ON the transistor 16 to a greater degree than the transistor 14, thereby further reducing the voltage at the output node 38.

One disadvantage of the current sensing amplifier 10 is shown in FIG. 1 is that it may be susceptible to being responsive to noise signals, thereby resulting in invalid data. This sensitivity to noise signals may result from the drains of the sensing transistor 14, 16 being equilibrated to the same voltage prior to sensing. Therefore, if a noise signal is received at one of the input nodes 26, 28 the change in the voltage at one input node compared to the other may cause the sense transistors 14, 16 to respond because of the high gain of the transistors 14, 16. This problem might be reduced by reducing the gain of the transistors 14, 16, but doing so might reduce the speed at which the sense amplifier 10 can sense a differential current.

Figure 2:
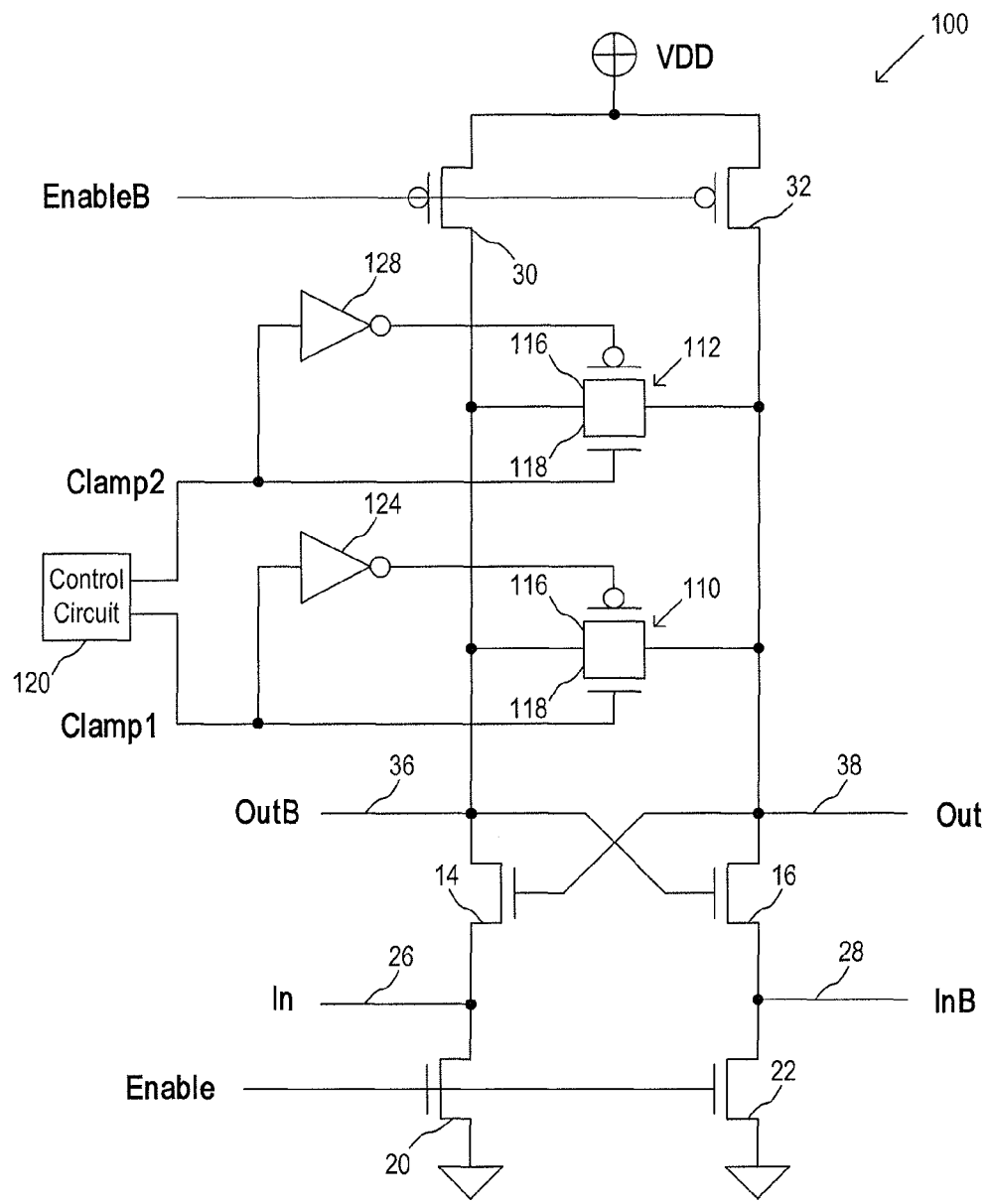
FIG. 2 is a schematic diagram of a current sense amplifier according to one embodiment.

An embodiment of a current sense amplifier 100 that may avoid some or all of these problems is shown in FIG. 2. The current sense amplifier 100 may use many of the same components that are used in the prior art current sense amplifier 10 shown in FIG. 1, and these common components may function in essentially the same manner. Therefore components in the current sense amplifier 100 of FIG. 2 have been provided with the same reference numerals as the corresponding components in the current sense amplifier 10 of FIG. 1, and an explanation of their operation will not be repeated. The current sense amplifier 100 of FIG. 2 differs from the current sense amplifier 10 of FIG. 1 by the use of two clamping circuits 110, 112 rather than a single clamping circuit 40 used in the sense amplifier 10, and in the use of a pass gate having both a PMOS transistor 116 and an NMOS transistor 118 instead of the single NMOS transistor 42 used in the clamping circuit 40 of the sense amplifier 10. The NMOS transistor 118 in the clamping circuit 110 may be coupled to one output of a control circuit 120, and the PMOS transistor 116 in the clamping circuit 110 may be coupled to the same output of a control circuit 120 through an inverter 124. In the same manner, the NMOS transistor 118 in the clamping circuit 112 may be coupled to another output of the control circuit 120, and the PMOS transistor 116 in the clamping circuit 112 may be coupled to the same output of a control circuit 120 through an inverter 128. The use of both the PMOS transistor 116 and the NMOS transistor 118 in each clamping circuit 110, 112 may allow the output nodes 36, 38 to be coupled to each other regardless of the voltages of the output nodes 36, 38. In contrast, the single NMOS transistor 42 used in the clamping circuit 40 may require that the output nodes 36, 38 be at a voltage that is lower than the voltage used for the EQ signal by at least the threshold voltage of the transistor 42.

Figure 3:
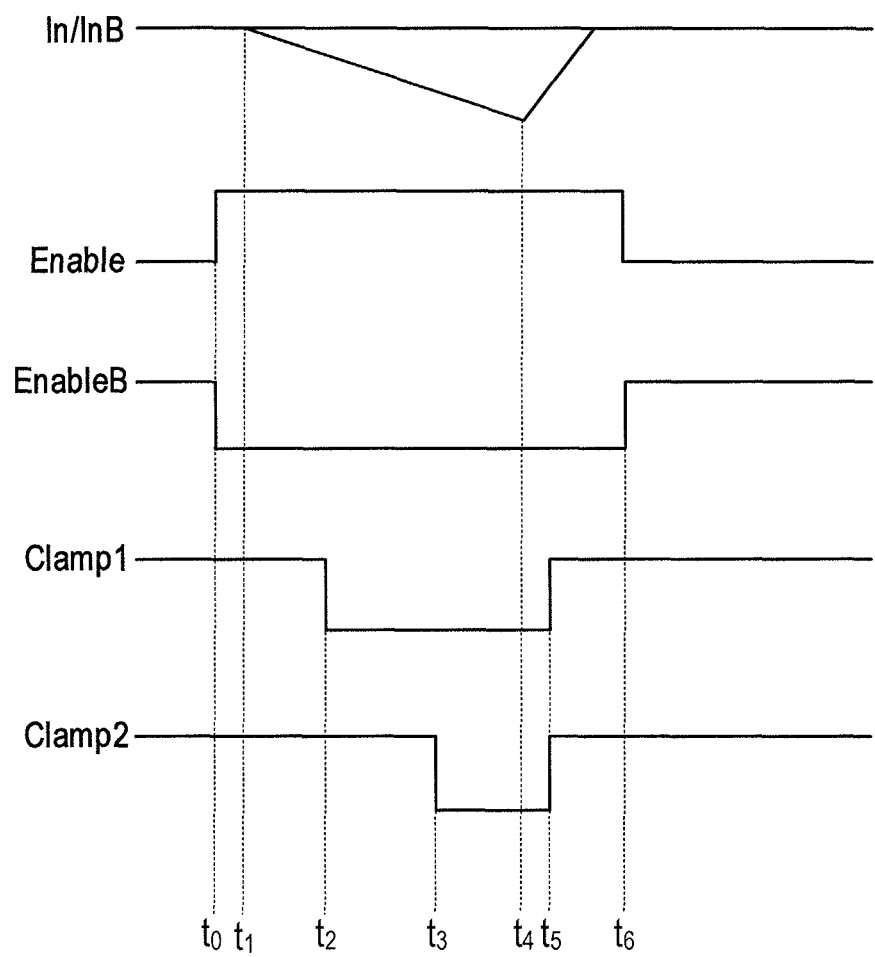
FIG. 3 is a timing diagram showing one embodiment for operating the current sense amplifier of FIG. 2.

The current sense amplifier 100 of FIG. 2 also differs from the current sense amplifier 10 of FIG. 1 in the manner in which the clamping circuits 110, 112 are operated compared to the manner in which the clamping circuit 40 is operated. Instead of using the prior art technique of actuating the clamping circuit 40 only before a memory cell is to be sensed, the control circuit 120 may actuate the clamping circuit 110, 112 during the time that the memory cell is sensed. More specifically, as shown in FIG. 3, in one embodiment the sense amplifier 100 is enabled at time $t_0$ by transitioning the Enable signal high and transitioning the EnableB signal low. At that time, the clamping circuits 110, 112 are in an actuated condition by the respective high Clamp1 and Clamp2 signals. A short time later at time $t_1$, a memory cell is coupled to one of the input nodes 26, 28, and the differential current In/InB at the input nodes 26, 28 starts to increase negatively. The differential current In/InB reaches a peak at time $t_4$, and thereafter begins to decrease. Just after time $t_1$, the differential current In/InB is relatively small so a prior art sense amplifier 100 might be susceptible to responding to noise signals, thereby providing invalid data. However, the sense amplifier 100 may be relatively insensitive to noise signals because the actuated clamping circuits 110, 112 may limit the gain of the sense amplifier 100 at that time. Thereafter, when the differential current In/InB has increased significantly, the control circuit deactivates the clamping circuit 110 by transitioning the Clamp1 signal low, thereby increasing the gain of the sense amplifier 100. The gain of the sense amplifier 100 may again be increased at a later time $t_2$ without a significant risk of responding to noise signals because of the increased magnitude of the differential current In/InB and/or an increase in the differential output signal Out/OutB after the sense amplifier has responded to the differential current In/InB. Furthermore, after the magnitude of the differential current In/InB and/or the differential output signal Out/OutB has further increased, the gain of the sense amplifier 100 may be further increased without a significant risk of responding to noise signals. Therefore, the clamping circuit 112 may be deactivated at time $t_3$ by transitioning the Clamp2 signal low. Finally, the sense amplifier 100 may be disabled at time $t_6$ by transitioning the Enable signal low and the EnableB signal high. Thus, by staggering the deactivation of the clamping circuits 110, 112, the gain of the sense amplifier 100 may be gradually increased as the sense amplifier becomes gradually less susceptible to responding to noise signals.

Although the embodiment of the sense amplifier 100 shown in FIG. 2 uses two clamping circuits 110, 112, it should be understood that other configurations may also be used. For example, the sense amplifier 100 may use a single clamping circuit operated in a manner similar to the operation explained with reference to FIG. 3 in which the clamping circuit is active for at least a portion of the time that a memory cell is being sensed. By way of further example, the number of clamping circuits used in a current sense amplifier may be greater than two, and the times at which all or some of them may be disabled may be staggered.

Figure 4:
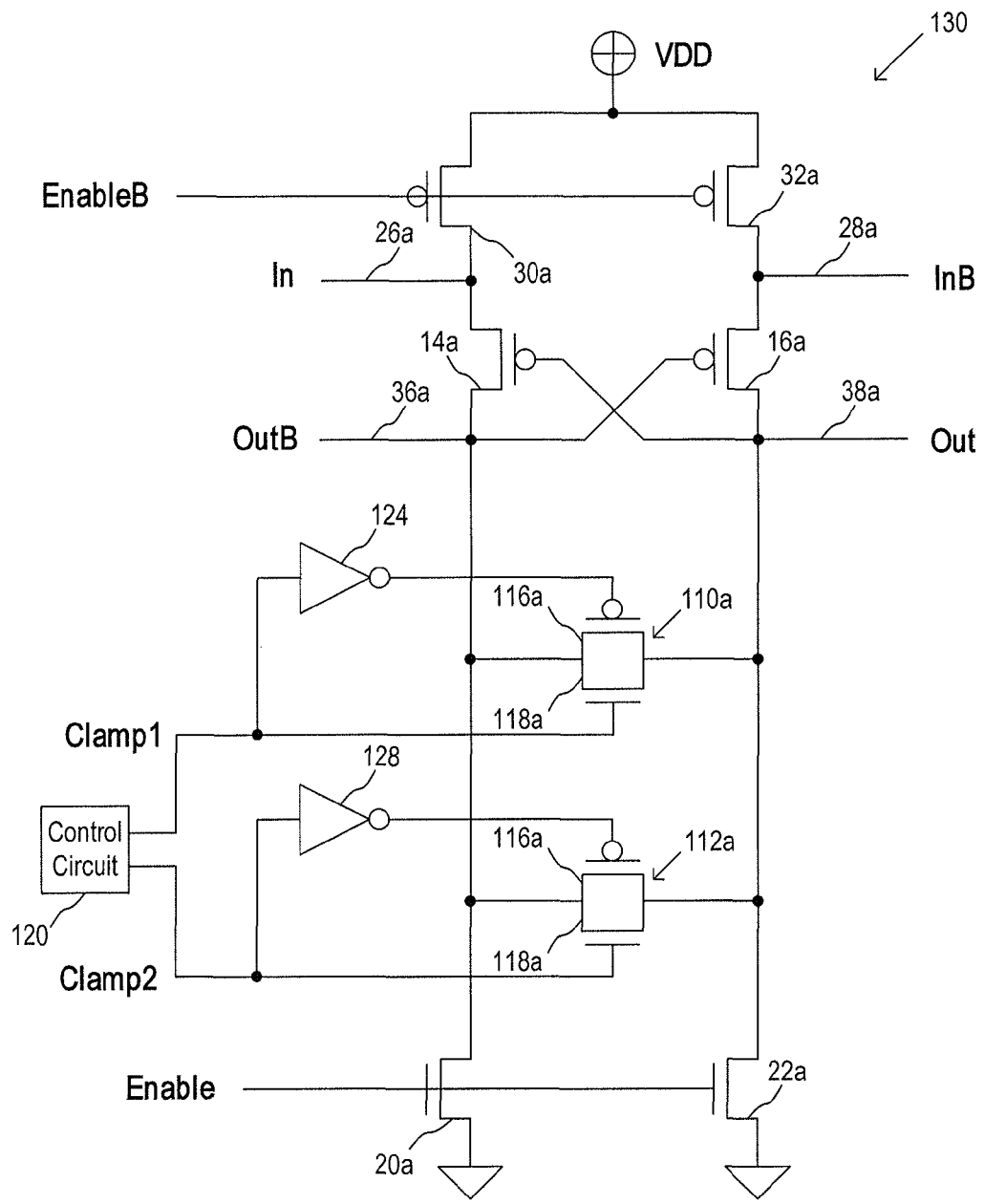
FIG. 4 is a schematic diagram of a current sense amplifier that is the complement of the current sense amplifier of FIG. 2.

An embodiment of a current sense amplifier 130 that is complementary to the current sense amplifier 100 is shown in FIG. 4. Therefore the components of the current sense amplifier 130 have been provided with reference numerals that differ from the corresponding components in the current sense amplifier 100 only by the suffix "a" in the event complementary components are used. In all other respects the structure and operation of the current sense amplifier 130 may be the same as the structure and operation of the current sense amplifier 100.

Figure 5:
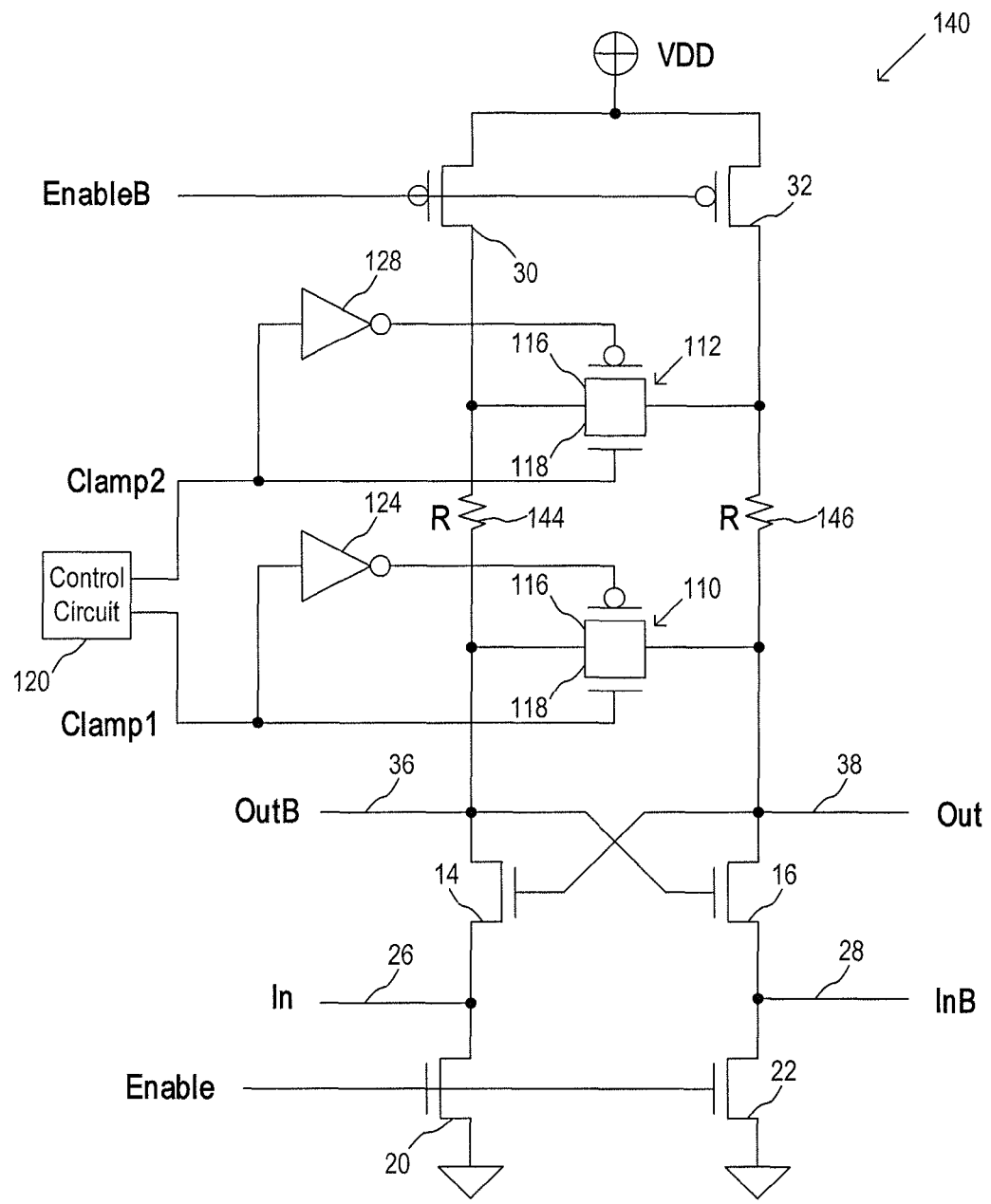
FIG. 5 is a schematic diagram of a current sense amplifier according to another embodiment.
Figure 6:
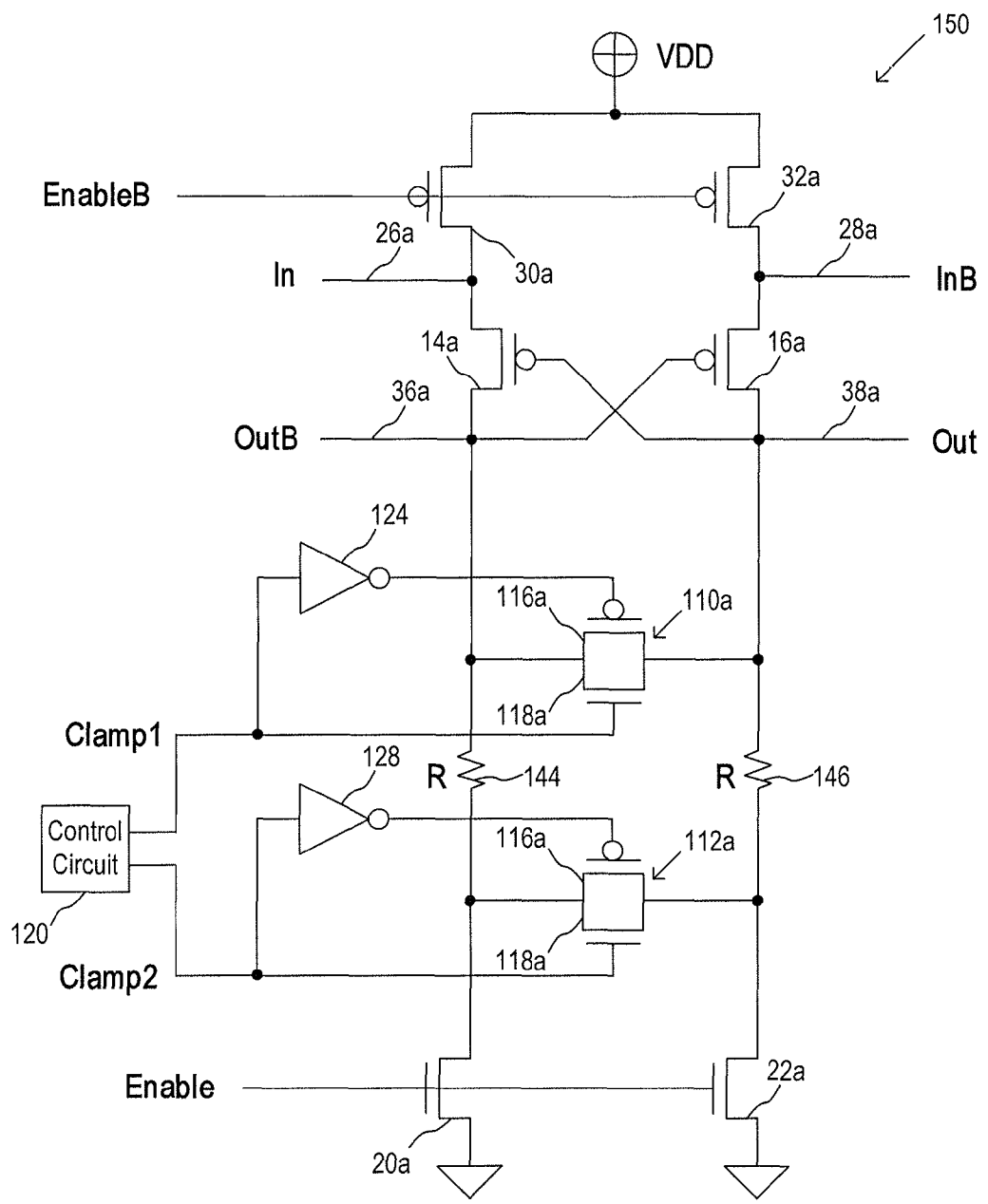
FIG. 6 is a schematic diagram of a current sense amplifier that is the complement of the current sense amplifier of FIG. 5.

Another embodiment of a current sense amplifier 140 is shown in FIG. 5, and a complementary current sense amplifier 150 is shown in FIG. 6. The current sense amplifiers 140, 150 may differ from the current sense amplifiers 100, 130, respectively, by separating the clamping circuits 110, 112 from each other with resistors 144, 146. The resistors 144, 146 may be used to adjust the output resistance and hence the gain of the sense amplifiers 140, 150 when the clamping circuit 112, 112a is enabled.

Figure 7:
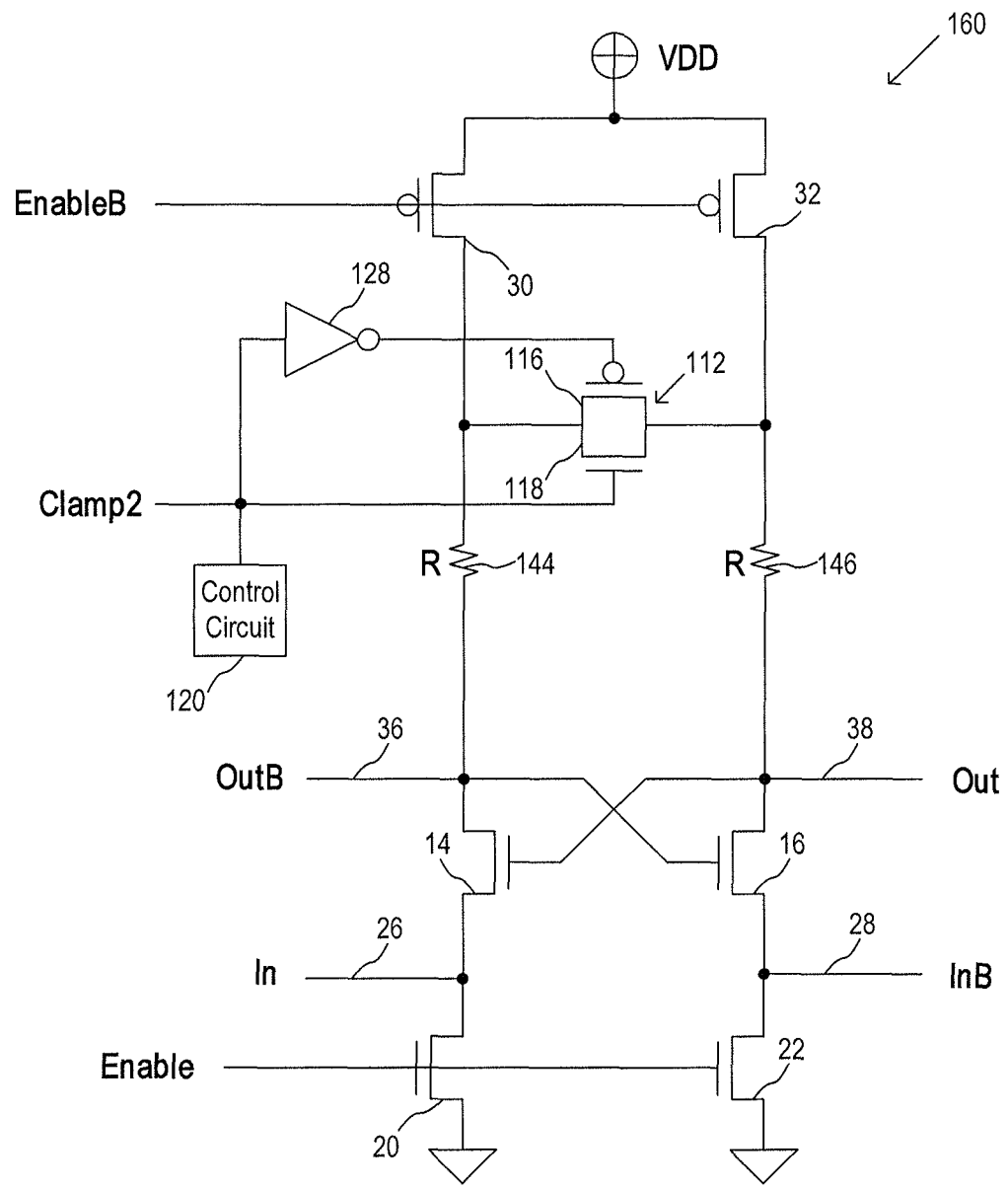
FIG. 7 is a schematic diagram of a current sense amplifier according to still another embodiment.
Figure 8:
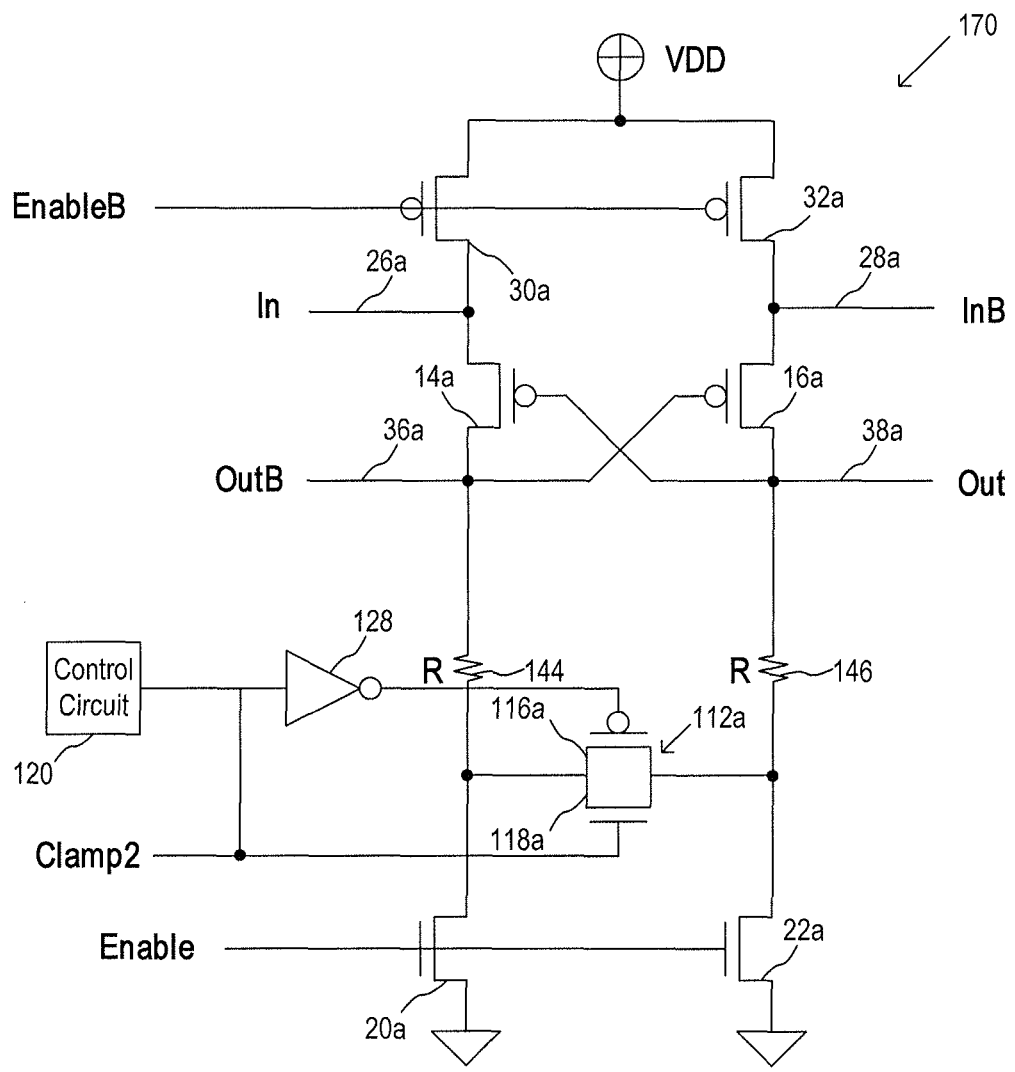
FIG. 8 is a schematic diagram of a current sense amplifier that is the complement of the current sense amplifier of FIG. 7.

Another embodiment of a current sense amplifier 160 and its complement 170 are shown in FIGS. 7 and 8, respectively. The current sense amplifiers 160, 170 differ from the current sense amplifiers 140, 150, respectively, by omitting the clamping circuit 110, 110a so that only a single clamping circuit 112, 112a is used. As explained above, a single clamping circuit 112, 112a may be used instead of multiple clamping circuits as long as the single clamping circuit is enabled at least during a portion of the time that a memory cell is being sensed, such as during the portion of the time that a memory cell is initially being sensed.

Figure 9:
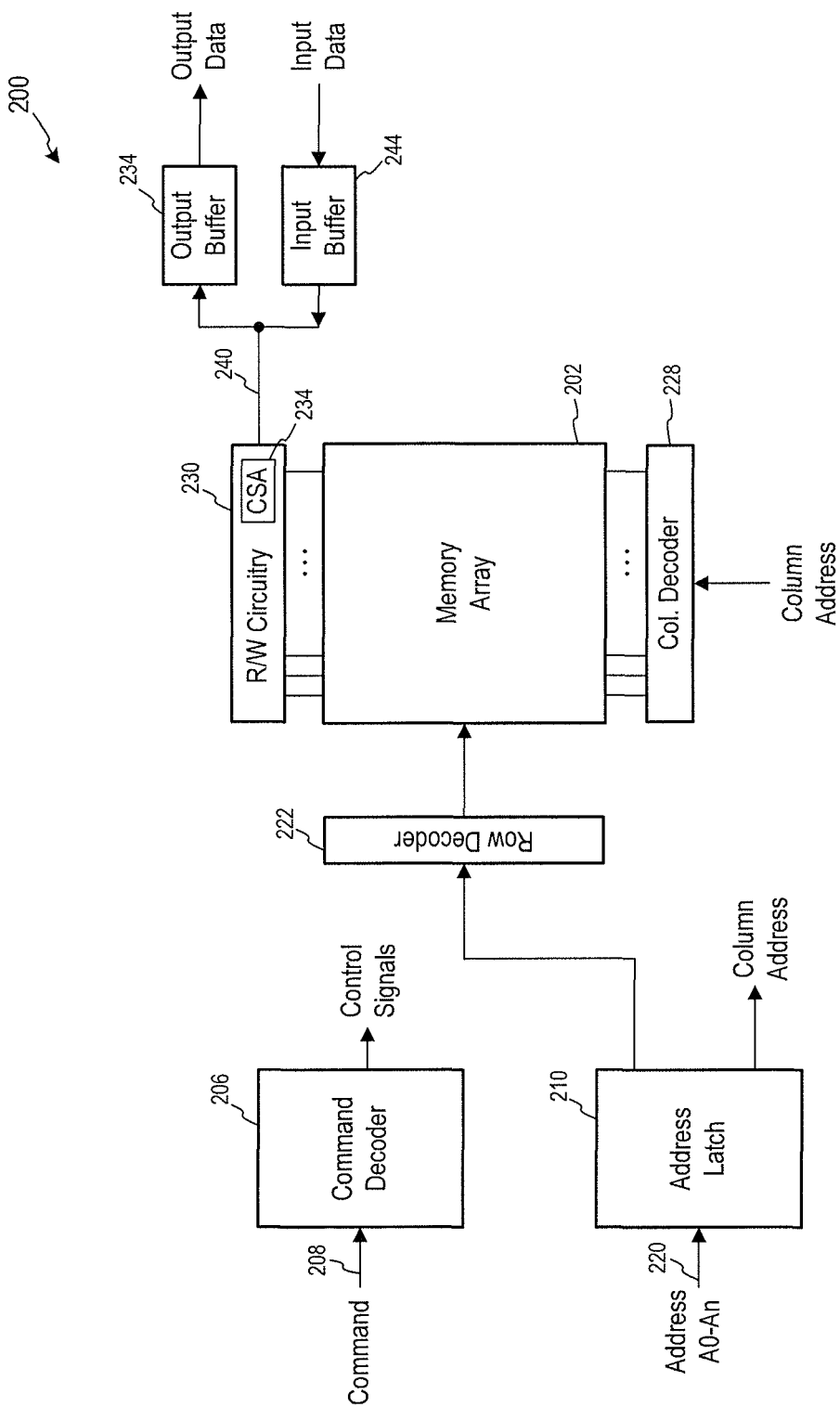
FIG. 9 is a block diagram of an embodiment of a memory system that may use the current sense amplifiers of FIGS. 2 and 4-8 or a current sense amplifier according to some other embodiment.

FIG. 9 is block diagram of an embodiment of a memory system 200 that may use the current sense amplifiers of FIGS. 2 and 4-8 or a current sense amplifier according to some other embodiment. The memory system 200 may include an array 202 of memory cells, which may be, for example, DRAM memory cells, SRAM memory cells, flash memory cells, or some other types of memory cells. The memory system 200 may include a command decoder 206 that receives memory commands through a command bus 208 and generates corresponding control signals within the memory system 200 to carry out various memory operations. Row and column address signals may be applied to the memory system 200 through an address bus 220 and provided to an address latch 210. The address latch 210 may then output a separate column address and a separate row address to the memory array 202. The column address decoder 228 may select digit lines extending through the array 202 corresponding to respective column addresses. The row address decoder 222 may activate respective rows of memory cells in the array 202 corresponding to received row addresses. The selected digit line corresponding to a received column address may be coupled to a read/write circuit 230. The read/write circuit 230 may include current sense amplifiers 234 to provide read data to a data output buffer 234 via an input-output data bus 240. The current sense amplifiers may be any of the current sense amplifiers 100, 130, 140, 150, 160, 170 shown in FIGS. 2 and 4-8, respectively, or a current sense amplifier according to some other embodiment. Write data may be applied to the memory array 202 through a data input buffer 244 and the memory array read/write circuitry 230. The command decoder 206 may respond to memory commands applied to the command bus 208 to perform various operations in the memory array 202. In particular, the command decoder 206 may be used to generate internal control signals to operate the control circuit 120 used in each of the current sense amplifiers 100, 130, 140, 150, 160, 170.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

We claim:

1. A current sense amplifier, comprising:
   first and second current sense transistors, the first current sense transistor including a gate coupled to a drain of the second current sense transistor and the second current sense transistor including a gate coupled to a drain of the first current sense transistor;
   an output node coupled to the drain of one of the first and second current sense transistors;
   an input node coupled to a source of one of the first and second current sense transistors;
   a first clamping circuit coupled between drains of the first and second current sense transistors, the clamping circuit being configured to couple the drains of the first and second current sense transistors to each other responsive to a first lamp signal;
   a second clamping circuit coupled between the drains of the first and second current sense transistors, the second clamping circuit configured to couple the drains of the first and second current sense transistors to each other responsive to a second clamp signal; and
   a control circuit coupled to the clamping circuit, the control circuit configured to generate both the first clamp signal and the second clamp signal and apply the first clamp signal to the first clamping circuit and apply the second clamp signal to the second clamp signal to the second clamping circuit to actuate the first and second clamping circuits during at least some of a time that the current sense amplifier is sensing current coupled to or from the input node of the current sense amplifier and to deactivate the first and second clamping circuits before the current sense amplifier has completed sensing current coupled to or from the input node of the current sense amplifier.

2. The current sense amplifier of claim 1 wherein the control circuit is configured to apply the first clamp signal to the second clamping circuit during an initial period when the current sense amplifier initially senses current coupled to or from the input node of the current sense amplifier.

3. The current sense amplifier of claim 1 wherein the control circuit is configured to terminate applying the first clamp signal to the first clamping circuit before the current sense amplifier has completed sensing current coupled to or from the input node of the current sense amplifier.

4. The current sense amplifier of claim 1 wherein the current sense transistors comprises respective NMOS transistors.

5. The current sense amplifier of claim 1 wherein the control circuit is configured to apply the first and second clamp signals to the first and second clamping circuits, respectively, during an initial period when the current sense amplifier initially senses current coupled to or from the input node of the current sense amplifier.

6. The current sense amplifier of claim 5 wherein the control circuit configured to terminate applying the first and second clamp signal to the clamping circuit at different times before the current sense amplifier has completed sensing current coupled to or from the input node of the current sense amplifier.

7. The current sense amplifier of claim 1, further comprising resistor coupled between the first and second clamping circuits, the resistor being coupled between the second clamping circuit and the drain of one of the first and second current sense transistors.

8. The current sense amplifier of claim 1 wherein the first clamping circuit comprises a pass gate.

9. The current sense amplifier of claim 8 wherein the pass gate comprises:
   a NMOS transistor coupled between the drains of the first and second current sense transistors;
   a PMOS transistor coupled between the drains of the first and second current sense transistors; and
   an inverter coupled between gates of the NMOS and PMOS transistors and an input of the inverter coupled to a control terminal.

10. The current sense amplifier of claim 1, further comprising:
    a first enable transistor coupled between the first current sense transistor and a supply voltage; and
    a second enable transistor coupled between the second current sense transistor and the supply voltage.

11. A memory device, comprising:
    an array of memory cells;
    a read data path coupled to a set of data bus terminals; and
    a plurality of current sense amplifiers coupled to respective sets of memory cells in the array, each of the plurality of current sense amplifiers being configured to couple read data to one of the data bus terminals in the set responsive to sensing current from a respective one of the memory cells, each of the current sense amplifiers comprising:
- first and second current sense transistors, a drain of one of the first and second current sense transistors being coupled to the read data path, and a source of one of the first and second current sense transistors being coupled to the array, and the first current sense transistor including a gate coupled to the drain of the second current sense transistor and the second current sense transistor including a gate coupled to the drain of the first current sense transistor;
- a first clamping circuit coupled between drains of the first and second current sense transistors, the clamping circuit being configured to couple the drains of the first and second current sense transistors to each other responsive to a first clamp signal;
- a second clamping circuit coupled between the drains of the first and second current sense transistors, the second clamping circuit configured to couple the drains of the first and second current sense transistors to each other responsive to a second clamp signal; and
- a control circuit coupled to the clamping circuit, the control circuit configured to generate both the first clamp signal and the second clamp signal and apply the first clamp signal to the first clamping circuit and apply the second clamp signal to the second clamp signal to the second clamping circuit to actuate the first and second clamping circuits during at least some of the time that the current sense amplifier is sensing current coupled to the current sense amplifier from one of the memory cells in the array or coupled from the current sense amplifier to one of the memory cells in the array and to deactivate the first and second clamping circuits before the current sense amplifier has completed sensing current coupled to the current sense amplifier from one of the memory cells in the array or coupled from the current sense amplifier to one of the memory cells in the array.

12. The memory device of claim 11 wherein the control circuit is configured to apply the first clamp signal to the first clamping circuit during an initial period when the current sense amplifier initially senses current coupled to the current sense amplifier from one of the memory cells in the array or initially senses current coupled from the current sense amplifier to one of the memory cells in the array.

13. The memory device of claim 12 wherein the control circuit is configured to terminate applying the first clamp signal to the first clamping circuit before the current sense amplifier has completed sensing current coupled to the current sense amplifier from one of the memory cells in the array or has completed sensing current coupled from the current sense amplifier to one of the memory cells in the array.

14. The memory device of claim 11 wherein the control circuit is configured to apply the first and second clamp signals to the first and second clamping circuits, respectively, during an initial period when the current sense amplifier initially senses current coupled to the current sense amplifier from one of the memory cells in the array or initially senses current coupled from the current sense amplifier to one of the memory cells in the array.

15. The memory device of claim 14 wherein the control circuit is configured to terminate applying the first and second clamp signal to the clamping circuit at different times before the current sense amplifier has completed sensing current coupled to the current sense amplifier from one of the memory cells in the array or has completed sensing current coupled from the current sense amplifier to one of the memory cells in the array.

16. The memory device of claim 11, further comprising a resistor coupled between the first and second clamping circuits, the resistor being coupled between the second clamping circuit and the drain of one of the first and second current sense transistors.

17. The memory device of claim 11 wherein the array of memory cells comprises an array of dynamic random access memory cells.

18. The memory device of claim 11, further comprising:
- a first enable transistor coupled between the first current sense transistor and a memory device supply voltage; and
- a second enable transistor coupled between the second current sense transistor and the memory device supply voltage.

19. A method of operating a current sense amplifier having first and second current sense transistors, each transistor including a source, a gate, and a drain, and the gates of the first current sense transistor coupled to the drain of the second current sense transistors and the gate of the second current sense transistor coupled to the drain of the first current sense transistor, the method comprising:
- coupling drains of the first and second current sense transistors to each other and terminating the coupling of the drains of the first and second current sense transistors to each other before the current sense amplifier has completed sensing current coupled to or from the source of one of the first and second current sense transistors, wherein coupling the drains of the first and second current sense transistors to each other comprises:
  - coupling the drains of the first and second current sense transistors to each other through first and second coupling paths that are different from each other during at least some of the time that the current sense amplifier is sensing current coupled to or from the source of one of the first and second current sense transistors;
  - terminating the coupling of the drains of the first and second current sense transistors to each other through the first coupling path at a first time before the current sense amplifier has completed sensing current coupled to or from the source of one of the first and second current sense transistors; and
  - terminating the coupling of the drains of the first and second current sense transistors to each other through the second coupling path at a second time before the current sense amplifier has completed sensing current coupled to or from the source of one of the first and second current sense transistors, the second time being different from the first time.

20. The method of claim 19 wherein the act of coupling the drains of the first and second current sense transistors to each other further comprises coupling the drains of the first and second current sense transistors to each other during an initial period when the current sense amplifier is initially sensing current coupled to or from the source of one of the first and second current sense transistors.

* * * * *